(12) United States Patent
Inoue et al.

(10) Patent No.: US 12,454,612 B2
(45) Date of Patent: *Oct. 28, 2025

(54) LIQUID RESIN COMPOSITION FOR COMPRESSION MOLDING AND ELECTRONIC COMPONENT APPARATUS

(71) Applicants: Hitachi Chemical Company, Ltd., Tokyo (JP); NAMICS CORPORATION, Niigata (JP)

(72) Inventors: Hidetoshi Inoue, Tokyo (JP); Takayuki Matsuzaki, Tokyo (JP); Hisato Takahashi, Tokyo (JP); Tsuyoshi Kamimura, Niigata (JP); Haruyuki Yoshii, Niigata (JP)

(73) Assignees: Resonac Corporation, Tokyo (JP); NAMICS Corporation, Niigata (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/618,635

(22) PCT Filed: May 31, 2018

(86) PCT No.: PCT/JP2018/021060
§ 371 (c)(1),
(2) Date: Dec. 2, 2019

(87) PCT Pub. No.: WO2018/221682
PCT Pub. Date: Dec. 6, 2018

(65) Prior Publication Data
US 2020/0181392 A1   Jun. 11, 2020

(30) Foreign Application Priority Data

May 31, 2017 (JP) ................................. 2017-108716

(51) Int. Cl.
| | | |
|---|---|---|
| *C08L 63/00* | (2006.01) | |
| *C08G 59/24* | (2006.01) | |
| *C08G 59/28* | (2006.01) | |
| *C08G 59/32* | (2006.01) | |
| *C08K 3/04* | (2006.01) | |
| *C08K 3/36* | (2006.01) | |
| *C08K 5/3445* | (2006.01) | |
| *C08K 5/5419* | (2006.01) | |
| *H01L 23/29* | (2006.01) | |
| *H01L 23/31* | (2006.01) | |

(52) U.S. Cl.
CPC ............ *C08L 63/00* (2013.01); *C08G 59/245* (2013.01); *C08G 59/28* (2013.01); *C08G 59/3227* (2013.01); *C08K 3/04* (2013.01); *C08K 3/36* (2013.01); *C08K 5/3445* (2013.01); *C08K 5/5419* (2013.01); *H01L 23/295* (2013.01); *H01L 23/3107* (2013.01); *C08K 2201/003* (2013.01)

(58) Field of Classification Search
CPC ....... C08L 63/00; C08G 59/245; C08G 59/28; C08G 59/3227; C08K 3/04; C08K 3/36; C08K 5/3445; C08K 5/5419; C08K 2201/003; H01L 23/295; H01L 23/3107
USPC ........................................................ 525/526
See application file for complete search history.

(56) References Cited

U.S. PATENT DOCUMENTS

| | | | |
|---|---|---|---|
| 2005/0187309 A1* | 8/2005 | Watanabe ............ | C09D 11/101 522/75 |
| 2008/0039555 A1 | 2/2008 | Ruyters et al. | |
| 2011/0241227 A1 | 10/2011 | Oka | |
| 2012/0126434 A1 | 5/2012 | Koda | |
| 2013/0197129 A1 | 8/2013 | Akiba et al. | |
| 2015/0008455 A1* | 1/2015 | Tozawa ............... | C08K 5/34924 257/88 |
| 2017/0210951 A1 | 7/2017 | Abe et al. | |
| 2017/0349743 A1* | 12/2017 | Otake .................. | C08K 5/3415 |
| 2020/0181392 A1 | 6/2020 | Inoue et al. | |

FOREIGN PATENT DOCUMENTS

| | | | | |
|---|---|---|---|---|
| CN | 101121878 A | 2/2008 | | |
| CN | 105778409 A | 7/2016 | | |
| EP | 1887033 A1 | 2/2008 | | |
| EP | 2280044 A1 | 2/2011 | | |
| JP | S6189247 A | 5/1986 | | |
| JP | 2000-198831 A | 7/2000 | | |
| JP | 2003-073453 A | 3/2003 | | |
| JP | 2003-292727 A | 10/2003 | | |
| JP | 2003-335923 A | 11/2003 | | |
| JP | 2004099636 A | * | 4/2004 | ............. H01L 24/29 |
| JP | 2004210901 A | * | 7/2004 | |
| JP | 2006-176678 A | 7/2006 | | |
| JP | 2007-023272 A | 2/2007 | | |
| JP | 2007-138002 A | 6/2007 | | |
| JP | 2007-182562 A | 7/2007 | | |
| JP | 2008-045123 A | 2/2008 | | |

(Continued)

OTHER PUBLICATIONS

Yokota, JP 2004-099636 A machine translation in English, Apr. 2, 2004 (Year: 2004).*

(Continued)

*Primary Examiner* — David T Karst

(74) *Attorney, Agent, or Firm* — Fitch, Even, Tabin & Flannery LLP

(57) ABSTRACT

A liquid resin composition for compression molding contains an aliphatic epoxy compound (A), an epoxy compound (B) having an aromatic ring in a molecule, a nitrogen-containing heterocyclic compound (C), and an inorganic filler (D).

10 Claims, No Drawings

(56) References Cited

FOREIGN PATENT DOCUMENTS

| JP | 2008-150555 | A | | 7/2008 | |
|---|---|---|---|---|---|
| JP | 20091637372 | | | 7/2009 | |
| JP | 2009221424 | A | | 10/2009 | |
| JP | 2010-118649 | A | | 5/2010 | |
| JP | 2012-060021 | A | | 3/2012 | |
| JP | 2012-074613 | A | | 4/2012 | |
| JP | 2012-077129 | A | | 4/2012 | |
| JP | 2012162585 | A | | 8/2012 | |
| JP | 2013-064152 | A | | 4/2013 | |
| JP | 2013163747 | A | | 8/2013 | |
| JP | 2014-152314 | A | | 8/2014 | |
| JP | 2014185296 | A | * | 10/2014 | ............ C08G 59/40 |
| JP | 2015-013950 | A | | 1/2015 | |
| JP | 2015-174906 | A | | 10/2015 | |
| JP | 2015-189847 | A | | 11/2015 | |
| JP | 2017-039802 | A | | 2/2017 | |
| JP | 2020-029494 | A | | 2/2020 | |
| KR | 20110110225 | A | | 10/2011 | |
| TW | 200833770 | A | | 8/2008 | |
| WO | 2012-105071 | A1 | | 8/2012 | |
| WO | 2015182730 | A1 | | 12/2015 | |
| WO | 2019146617 | A1 | | 8/2019 | |

OTHER PUBLICATIONS

Otani et al., JP 2014-185296 A machine translation in English, Oct. 8, 2014 (Year: 2014).*

Tsuchida, JP 2004-210901 A, machine translation in English, Jul. 29, 2004. (Year: 2004).*

Material included in the third-party observation dated Jan. 21, 2022, filed in European Patent Application No. EP18 809 408.0, which is a counterpart European application of the present application.

* cited by examiner

LIQUID RESIN COMPOSITION FOR COMPRESSION MOLDING AND ELECTRONIC COMPONENT APPARATUS

CROSS-REFERENCE TO RELATED APPLICATIONS

This application is a U.S. national phase application filed under 35 U.S.C. § 371 of International Application No. PCT/JP2018/021060, filed May 31, 2018, designating the United States, which claims priority from Japanese Patent Application No. 2017-108716, filed May 31, 2017, the entire contents of each of which are hereby incorporated herein by reference.

TECHNICAL FIELD

The present invention relates to a liquid resin composition for compression molding, and an electronic component apparatus.

BACKGROUND ART

In recent years, higher-density packaging has been advanced due to the finer wiring, multi-layering, and high pin count of elements, as well as the miniaturization and slimming down of packages in order to achieve the cost reduction, miniaturization, slimming down, weight reduction, higher performance, and more functionality of electronic component apparatuses. Thus, electronic component apparatuses having the almost the same size as those of elements such as ICs (integrated circuits), i.e., CSPs (chip size packages) have been widely used.

Especially, wafer level chip size packages resin-sealed in wafer stages have received attention. In such a wafer level chip size package, a large number of elements are sealed at one time by compression molding using a solid epoxy resin composition or printing molding using a liquid epoxy resin composition in a wafer stage, and singulated. Therefore, productivity can be greatly improved in comparison with methods in which elements are singulated and then sealed. However, the warpage of the sealed silicon wafer is prone to occur, the warpage becomes problematic in each step of subsequent transportation, grinding, inspection, and the singulation, and a problem that element characteristics are changed may occur depending on a device.

In the field of element sealing of electronic component apparatuses, resin sealing has conventionally been mainstream in view of productivity, costs, and the like, and epoxy resin compositions have been widely used. This is because epoxy resins have balances of various characteristics such as electrical characteristics, moisture resistance, heat resistance, mechanical characteristics, and adhesiveness to insert products. The warpage of a silicon wafer is considered to be caused by stress generated by the cure shrinkage of such an epoxy resin composition, a mismatch between the thermal expansion coefficients of the silicon wafer and the epoxy resin composition, or the like. The warpage of a silicon wafer may result in the deterioration of the reliability of a package. Therefore, a decrease in stress is required in epoxy resin compositions used in such applications. High filling of an inorganic filler to decrease a thermal expansion coefficient and use of a flexibility-imparting agent, a flexible resin, or the like to decrease an elastic modulus are considered to be effective for decreasing stress in an epoxy resin composition.

For example, Patent Document 1 describes a liquid epoxy resin composition for sealing, including a liquid bisphenol type epoxy resin, silicone rubber fine particles, a silicone-modified epoxy resin, an aromatic amine curing agent, an inorganic filler, and an organic solvent.

Patent Document 2 describes a liquid epoxy resin composition for sealing, including a liquid epoxy resin, an aromatic amine curing agent, fine particles of a core-shell silicone polymer including a core of a solid silicone polymer and a shell of an organic polymer, an inorganic filler, and an organic solvent.

As described above, a liquid epoxy resin composition including at least a liquid epoxy resin, a curing agent, rubber fine particles, and an inorganic filler is disclosed as a liquid resin composition for compression molding, for reducing the warpage of a sealed silicon wafer, in conventional technologies.

Patent Document 3 discloses a liquid molding agent including an epoxy resin, an acid anhydride curing agent, and an inorganic filler.

CITATION LIST

Patent Document

[Patent Document 1] Japanese Patent Application Laid-Open (JP-A) No. 2007-23272
[Patent Document 2] JP-A No. 2008-150555
[Patent Document 3] JP-A No. 2014-152314

SUMMARY OF INVENTION

Technical Problem

In the case of Patent Document 1 using silicone rubber fine particles and a silicone-modified epoxy resin or Patent Document 2 using fine particles of a core-shell silicone polymer, the elastic modulus of an epoxy resin cured product can be decreased to decrease stress. However, a problem that it is impossible to sufficiently reduce the warpage of a thinner silicon wafer or a silicon wafer having a 12-inch or larger size may occur. In the case of Patent Document 3 using an acid anhydride curing agent, the viscosity of a composition can be reduced to a low level, and the linear expansion coefficient of an epoxy resin cured product can be decreased by filling a large amount of an inorganic filler. However, the elastic modulus of an epoxy resin cured product may be high, as a result of which it is impossible to sufficiently reduce the warpage of a large-sized silicon wafer. In order to further achieve cost reduction and slimming down of packages, the diameters of silicon wafers tend to be increasingly enlarged, and the thicknesses of the silicon wafers tend to be reduced. Thus, it is necessary to reduce the warpage of the silicon wafers.

The problem of the warpage of silicon wafers is considered to be a problem which can generally occur in semiconductor wafers such as compound semiconductor wafers such as SiC (silicon carbide) wafers, sapphire wafers, and GaAs (gallium arsenide) wafers.

One aspect of the invention has been made in consideration of the above-described circumstances. An object of the invention is to provide a liquid resin composition for compression molding, which can suppress the occurrence of the warpage of a semiconductor wafer, and an electronic component apparatus using the liquid resin composition for compression molding.

Solution to Problem

An aspect of the invention relates to the following.
<1> A liquid resin composition for compression molding, comprising an aliphatic epoxy compound (A), an epoxy compound (B) having an aromatic ring in a molecule, a nitrogen-containing heterocyclic compound (C), and an inorganic filler (D).
<2> The liquid resin composition for compression molding according to <1>, wherein the aliphatic epoxy compound (A) comprises a compound represented by the following Formula (I):

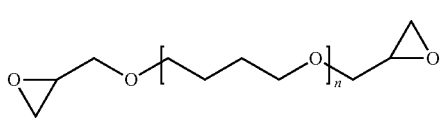

wherein, in Formula (I), n is an integer from 1 to 15.
<3> The liquid resin composition for compression molding according to <1> or <2>, wherein a number-average molecular weight of the aliphatic epoxy compound (A) is from 200 to 10000.
<4> The liquid resin composition for compression molding according to any one of <1> to <3>, wherein the epoxy compound (B) having an aromatic ring in a molecule comprises at least one of N,N-diglycidylorthotoluidine or N,N-bis(2,3-epoxypropyl)-4-(2,3-epoxypropoxy)aniline.
<5> The liquid resin composition for compression molding according to any one of <1> to <4>, further comprising a coupling agent (E).
<6> An electronic component apparatus, comprising an element sealed with the liquid resin composition for compression molding according to any one of <1> to <5>.

Advantageous Effects of Invention

In accordance with an aspect of the invention, a liquid resin composition for compression molding, which can suppress the occurrence of the warpage of a semiconductor wafer, and an electronic component apparatus using the liquid resin composition for compression molding can be provided.

DESCRIPTION OF EMBODIMENTS

Embodiments of the invention are described below in detail. It is noted here, however, that the invention is not restricted to the below-described embodiments. In the below-described embodiments, the constituents thereof (including element steps and the like) are not indispensable unless otherwise specified. The same applies to the numerical values and ranges thereof, without restricting the invention.

In the disclosure, those numerical ranges that are expressed with "to" each denote a range that includes the numerical values stated before and after "to" as the minimum value and the maximum value, respectively.

In a set of numerical ranges that are stated stepwisely in the disclosure, the upper limit value or the lower limit value of a numerical range may be replaced with the upper limit value or the lower limit value of other numerical range. Further, in a numerical range stated in the disclosure, the upper limit or the lower limit of the numerical range may be replaced with a relevant value indicated in any of Examples.

In the disclosure, a component may include a plurality of different substances corresponding thereto. When there are plural kinds of substances that correspond to a component of a composition, the indicated content ratio or content amount of the component in the composition means, unless otherwise specified, the total content ratio or content amount of the plural kinds of substances existing in the composition.

In the disclosure, particles corresponding to a component may include a plurality of different kinds of particles. When there are plural kinds of particles that correspond to a component of a composition, the indicated particle size of the component in the composition means, unless otherwise specified, a value determined for a mixture of the plural kinds of particles existing in the composition.

In the disclosure, the term "layer" or "film" includes, when observing a region where a layer or film is present, a case in which the layer or the film is formed only on a part of the region in addition to a case in which the layer or the film is formed on the entirety of the region.

<Liquid Resin Composition for Compression Molding>

A liquid resin composition for compression molding of the disclosure contains an aliphatic epoxy compound (A), an epoxy compound (B) having an aromatic ring in a molecule, a nitrogen-containing heterocyclic compound (C), and an inorganic filler (D). The liquid resin composition for compression molding of the disclosure may include an additional constituent other than the constituents described above, if necessary. According to the liquid resin composition for compression molding of the disclosure, the occurrence of the warpage of a semiconductor wafer can be suppressed.

Each constituent included in the liquid resin composition for compression molding will be described below.

-Aliphatic Epoxy Compound (A)-

The liquid resin composition for compression molding includes the aliphatic epoxy compound (A).

In the disclosure, the aliphatic epoxy compound (A) refers to an aliphatic compound that has at least one epoxy group in a molecule, and does not have a cyclic structure except an epoxy group in the molecule. The liquid resin composition for compression molding includes the aliphatic epoxy compound (A), whereby the occurrence of the warpage of a semiconductor wafer tends to be more efficiently suppressed even in a case in which the liquid resin composition for compression molding is used in an aspect in which the liquid resin composition for compression molding is applied to the semiconductor wafer, and is cured.

A known or common aliphatic epoxy compound can be used as the aliphatic epoxy compound (A), and the aliphatic epoxy compound (A) is not particularly limited.

Specific examples of the aliphatic epoxy compound (A) include: a monofunctional aliphatic epoxy compound having one epoxy group in a molecule, such as an alkyl alcohol glycidyl ether [butyl glycidyl ether, 2-ethylhexyl glycidyl ether, or the like] or an alkenyl alcohol glycidyl ether [vinyl glycidyl ether, allyl glycidyl ether, or the like]; a bifunctional aliphatic epoxy compound having two epoxy groups in a molecule, such as an alkylene glycol diglycidyl ether, a poly(alkylene glycol) diglycidyl ether, or an alkenylene glycol diglycidyl ether; and a polyfunctional aliphatic epoxy compound having three or more epoxy groups in a molecule, such as a polyglycidyl ether of a trifunctional or greater functional alcohol such as trimethylolpropane, pentaerythritol, or dipentaerythritol [trimethylolpropane triglycidyl ether, pentaerythritol (tri or tetra)glycidyl ether, dipentaerythritol (tri, tetra, penta, or hexa)glycidyl ether, or the like].

Especially, a bifunctional aliphatic epoxy compound is preferred as the aliphatic epoxy compound (A) in view of still more efficiently suppressing the warpage of a semiconductor wafer in the case of forming a cured product on the semiconductor wafer.

More specific examples of the bifunctional aliphatic epoxy compound include: alkylene glycol diglycidyl ethers (alkanediol diglycidyl ethers) such as ethylene glycol diglycidyl ether, propylene glycol diglycidyl ether, 1,3-propanediol diglycidyl ether, 2-methyl-1,3-propanediol diglycidyl ether, 2-butyl-2-ethyl-1,3-propanediol diglycidyl ether, 1,4-butanediol diglycidyl ether (tetramethylene glycol diglycidyl ether), neopentyl glycol diglycidyl ether, 3-methyl-2,4-pentanediol diglycidyl ether, 2,4-pentanediol diglycidyl ether, 1,5-pentanediol diglycidyl ether (pentamethylene glycol diglycidyl ether), 3-methyl-1,5-pentanediol diglycidyl ether, 2-methyl-2,4-pentanediol diglycidyl ether, 2,4-diethyl-1,5-pentanediol diglycidyl ether, 1,6-hexanediol diglycidyl ether (hexamethylene glycol diglycidyl ether), 1,7-heptanediol diglycidyl ether, 3,5-heptanediol diglycidyl ether, 1,8-octanediol diglycidyl ether, 2-methyl-1,8-octanediol diglycidyl ether, and 1,9-nonanediol diglycidyl ether; and polyalkylene glycol diglycidyl ethers (also including oligoalkylene glycol diglycidyl ethers) such as diethylene glycol diglycidyl ether, triethylene glycol diglycidyl ether, tetraethylene glycol diglycidyl ether, dipropylene glycol diglycidyl ether, polyethylene glycol diglycidyl ether, polypropylene glycol diglycidyl ether, poly(ethylene glycol/propylene glycol)diglycidyl ether, ditetramethylene glycol diglycidyl ether, tritetramethylene glycol diglycidyl ether, polytetramethylene glycol diglycidyl ether, dipentamethylene glycol diglycidyl ether, tripentamethylene glycol diglycidyl ether, polypentamethylene glycol diglycidyl ether, dihexamethylene glycol diglycidyl ether, trihexamethylene glycol diglycidyl ether, and polyhexamethylene glycol diglycidyl ether.

In a certain aspect, a polyalkylene glycol diglycidyl ether is preferred, and a polyalkylene glycol diglycidyl ether in which the number of alkylene glycol (alkyleneoxy) units is from 1 to 20 (particularly, an alkylene glycol diglycidyl ether in which the number of alkylene glycol units is from 1 to 20, and the number of carbon atoms in an alkylene glycol unit is from 2 to 4) is more preferred, particularly in view of highly suppressing the warpage of a semiconductor wafer.

In another aspect, a polyalkylene glycol diglycidyl ether in which the number of alkylene glycol (alkyleneoxy) units is from 2 to 20 (particularly, an alkylene glycol diglycidyl ether in which the number of alkylene glycol units is from 2 to 20, and the number of carbon atoms in an alkylene glycol unit is from 2 to 4) is also acceptable.

The molecular weight of the aliphatic epoxy compound (A) (in the case of a polymer, a number-average molecular weight in terms of standard polystyrene by gel permeation chromatography (GPC) using tetrahydrofuran as an elution solvent) is not particularly limited, and is preferably from 200 to 10000, more preferably from 200 to 1200, still more preferably from 200 to 1000, and particularly preferably from 300 to 900. The warpage of a semiconductor wafer tends to be more efficiently suppressed by setting the molecular weight (or number-average molecular weight) of the aliphatic epoxy compound (A) in the range described above.

More specifically, preferred examples of the aliphatic epoxy compound (A) include a compound (diglycidyl ether of tetramethylene glycol, or diglycidyl ether of polytetramethylene glycol) represented by the following Formula (I). Use of such a compound tends to more efficiently suppress the warpage of a semiconductor wafer.

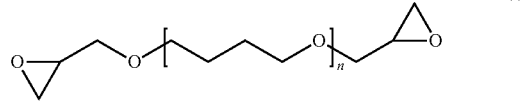

(I)

In Formula (I), n is an integer from 1 to 15.

In the liquid resin composition for compression molding, such aliphatic epoxy compounds (A) may be used singly, or in combination of two or more kinds thereof.

A commercially available product such as trade name "EPOGOSEY PT (general grade)" (Yokkaichi Chemical Company Limited, diglycidyl ether of polytetramethylene glycol, number-average molecular weight of from 700 to 800) can also be used as the compound represented by Formula (I).

The percentage content of the aliphatic epoxy compound (A) included in the liquid resin composition for compression molding is not particularly limited, and is preferably from 3% by mass to 40% by mass, more preferably from 5% by mass to 35% by mass, and still more preferably from 10% by mass to 30% by mass with respect to the total amount (total epoxy compound: 100% by mass) of compound having an epoxy group, included in the liquid resin composition for compression molding. Setting of the content amount of the aliphatic epoxy compound (A) at 3% by mass or more tends to further suppress the warpage of a semiconductor wafer. In contrast, setting of the content amount of the aliphatic epoxy compound (A) at 40% by mass or less tends to allow further improvement in the curability of the liquid resin composition for compression molding, thereby further improving the heat resistance of a cured product.

-Epoxy Compound (B) Having Aromatic Ring in Molecule-

The liquid resin composition for compression molding includes the epoxy compound (B) having an aromatic ring in a molecule.

A known or common aromatic epoxy compound can be used as the epoxy compound (B) having an aromatic ring in a molecule, and the epoxy compound (B) having an aromatic ring in a molecule is not particularly limited.

Specific examples of the epoxy compound (B) having an aromatic ring in a molecule include a glycidyl ether of a phenol such as bisphenol A, bisphenol F, bisphenol AD, bisphenol S, catechol, or resorcinol; a glycidyl ether ester of a hydroxycarboxylic acid such as p-hydroxybenzoic acid; a monoglycidyl ester or polyglycidyl ester of a carboxylic acid such as benzoic acid, phthalic acid, or terephthalic acid; a glycidyl amine type epoxy compound such as diglycidyl aniline, diglycidyl toluidine, triglycidyl-p-aminophenol, or tetraglycidyl-m-xylylenediamine; or an epoxy compound having a naphthalene skeleton such as a glycidyl ester of naphthol, or a glycidyl ether ester of β-hydroxynaphthoic acid. A novolac compound obtained by forming a phenol such as phenol, catechol, or resorcinol into novolac may be used.

Of these, glycidyl amine type epoxy compounds are preferred.

The epoxy compound (B) having an aromatic ring in a molecule, included in the liquid resin composition for compression molding, preferably exhibits a viscosity of from 30 mPa·s to 5000 mPa·s, and more preferably exhibits a viscosity of from 30 mPa·s to 1000 mPa·s, at 25° C. In a case in which the viscosity of the epoxy compound (B) having an aromatic ring in a molecule is in this range, it is possible to obtain a composition suitable for compression molding even in a case in which the inorganic filler (D) is blended into the liquid resin composition for compression molding in large quantities.

In the disclosure, a viscosity at 25° C. refers to a value measured using a rotary shear viscometer equipped with a cone plate (having a diameter of 48 mm and a cone angle of 1°) at a shear rate of 10 rev/min.

More specifically, preferred examples of the epoxy compound (B) having an aromatic ring in a molecule include N,N-bis(2,3-epoxypropyl)-4-(2,3-epoxypropoxy)aniline and N,N-diglycidylorthotoluidine. Use of such an epoxy compound tends to result in further improvement in the curability of the liquid resin composition for compression molding, thereby further improving the heat resistance of a cured product.

In a case in which N,N-bis(2,3-epoxypropyl)-4-(2,3-epoxypropoxy)aniline and N,N-diglycidylorthotoluidine are used together as the epoxy compounds (B) having an aromatic ring in a molecule, the content ratio between N,N-bis(2,3-epoxypropyl)-4-(2,3-epoxypropoxy)aniline and N,N-diglycidylorthotoluidine based on mass (N,N-bis (2,3-epoxypropyl)-4-(2,3-epoxypropoxy)aniline/N,N-diglycidylorthotoluidine) is preferably from 0.5 to 13.0, more preferably from 0.7 to 8.0, and still more preferably from 1.0 to 3.5.

The percentage content of the epoxy compound (B) having an aromatic ring in a molecule, included in the liquid resin composition for compression molding, is not particularly limited, and is preferably from 45% by mass to 95% by mass, more preferably from 55% by mass to 90% by mass, and still more preferably from 65% by mass to 85% by mass with respect to the total amount (total epoxy compound: 100% by mass) of compound having an epoxy group, included in the liquid resin composition for compression molding. Setting of the content amount of the epoxy compound (B) having an aromatic ring in a molecule at 45% by mass or more tends to result in improvement in curability. In contrast, setting of the content amount of the epoxy compound (B) having an aromatic ring in a molecule at 95% by mass or less tends to suppress the warpage of a semiconductor wafer.

The content ratio between the aliphatic epoxy compound (A) and epoxy compound (B) having an aromatic ring in a molecule, included in the liquid resin composition for compression molding, based on mass (aliphatic epoxy compound (A)/epoxy compound (B) having aromatic ring in molecule) is preferably from 0.05 to 1.22, more preferably from 0.11 to 0.82, and still more preferably from 0.17 to 0.54.

-Nitrogen-Containing Heterocyclic Compound (C)-

The liquid resin composition for compression molding includes the nitrogen-containing heterocyclic compound (C).

A known or common nitrogen-containing heterocyclic compound can be used as the nitrogen-containing heterocyclic compound (C) as long as allowing the polymerization of the aliphatic epoxy compound (A) and the epoxy compound (B) having an aromatic ring in a molecule to proceed, and the nitrogen-containing heterocyclic compound (C) is not particularly limited.

Specific examples of the nitrogen-containing heterocyclic compound (C) include imidazoles such as 2-methylimidazole, 2-undecylimidazole, 2-heptadecylimidazole, 2-ethyl-4-methylimidazole, 2-phenylimidazole, 2-phenyl-4-methyl-imidazole, 2,4-diamino-6-[2'-methylimidazolyl-(1)]ethyl-s-triazine, 2-phenyl-4,5-dihydroxymethylimidazole, 2-phenyl-4-methyl-5-hydroxymethylimidazole, and 2,3-dihydro-1H-pyrrolo[1,2-a]benzimidazole, diazabicycloundecene (DBU), DBU-phenolate, DBU-octylate, DBU-p-toluenesulfonate, DBU-formate, DBU-orthophthalate, DBU-phenol novolac resin salt, DBU-based tetraphenyl borate salt, diazabicyclononene (DBN), DBN-phenol novolac resin salt, diazabicyclooctane, pyrazole, oxazole, thiazole, imidazoline, pyrazine, morpholine, thiazine, indole, isoindole, benzimidazole, purine, quinoline, isoquinoline, quinoxaline, cinnoline, and pteridine. A nitrogen-containing heterocyclic compound (C) adducted with an epoxy resin or an isocyanate resin, or a microencapsulated nitrogen-containing heterocyclic compound (C), can be used. Of these, 2-phenyl-4-methylimidazole is preferred from the viewpoint of reactivity and storage stability.

The amount of the blended nitrogen-containing heterocyclic compound (C) is preferably from 2 parts by mass to 20 parts by mass, and more preferably from 3 parts by mass to 12 parts by mass with respect to 100 parts by mass in total of the aliphatic epoxy compound (A), the epoxy compound (B) having an aromatic ring in a molecule, and an additional epoxy compound used, if necessary. In a case in which the amount of the blended nitrogen-containing heterocyclic compound (C) is 2 parts by mass or more, the curing time of the liquid resin composition for compression molding is prevented from being too long, and the productivity of an electronic component apparatus tends to be improved. In a case in which the amount of the blended nitrogen-containing heterocyclic compound (C) is 20 parts by mass or less, the storage stability of the liquid resin composition for compression molding tends to be improved.

As far as the effect of the invention is not degraded, a curing agent such as liquid acid anhydride, liquefied phenol, or aromatic amine can be used together, if necessary. In such a case, the curing agent other than the nitrogen-containing heterocyclic compound (C) is preferably in an amount of less than 0.1 equivalent with respect to 1 equivalent of an epoxy compound in the liquid resin composition for compression molding.

-Inorganic Filler (D)-

The liquid resin composition for compression molding includes the inorganic filler (D).

A known or common inorganic filler can be used as the inorganic filler (D), and the inorganic filler (D) is not particularly limited.

Examples of the inorganic filler (D) include powders such as silicas (for example, fused silica and crystalline silica), calcium carbonate, clay, alumina, silicon nitride, silicon carbide, boron nitride, calcium silicate, potassium titanate, aluminum nitride, beryllia, zirconia, zircon, forsterite, steatite, spinel, mullite, and titania; beads obtained by spheroidizing the powders; and glass fibers. Examples of inorganic fillers with flame-retardant effects include aluminum hydroxide, magnesium hydroxide, zinc borate, and zinc molybdate. Such inorganic fillers (D) may be used singly, or in combination of two or more kinds thereof. Especially, fused silica is preferred from the viewpoint of reducing a linear expansion coefficient, and alumina is preferred from the viewpoint of high thermal conductivity. The shape of the inorganic filler (D) is preferably a spherical shape from the viewpoint of the higher filling of the inorganic filler (D) as well as the flowability and permeability of the liquid resin composition for compression molding into fine gaps.

The average particle diameter of the inorganic filler (D) is preferably from 1 μm to 20 μm, more preferably from 1.5 μm to 15 µm, and still more preferably from 2 µm to 10 µm, particularly in the case of spherical silica. In such a case, the average particle diameter refers to a particle diameter in which a volume cumulative particle size distribution measured using a laser diffraction method is 50%. In a case in which the average particle diameter of the inorganic filler (D) is 1 µm or more, high-concentration dispersion of the inorganic filler (D) into the liquid resin composition for compression molding tends to be facilitated. In a case in which the average particle diameter of the inorganic filler (D) is 20 µm or less, the amount of coarse grain constituent in the inorganic filler (D) tends to become small, whereby insufficient filling of the liquid resin composition for compression molding into fine gaps or streak-like defects in printing are suppressed, and surface smoothness is improved.

The percentage content of the inorganic filler (D) is preferably set in a range of from 73% by mass to 93% by mass, and more preferably in a range of from 78% by mass to 91% by mass with respect to the total amount of liquid resin composition for compression molding. In a case in which the percentage content of the inorganic filler (D) is 73% by mass or more, the effect of decreasing the thermal expansion coefficient of the cured product of the liquid resin composition for compression molding tends to be able to be obtained, thereby reducing warpage. In a case in which the percentage content of the inorganic filler (D) is 93% by mass or less, an increase in the viscosity of the liquid resin composition for compression molding tends to be able to be suppressed, thereby allowing application operation properties to be favorable.

-Coupling Agent (E)-

The liquid resin composition for compression molding may include a coupling agent (E), if necessary, in order to strengthen adhesiveness between a resin and an inorganic filler, or between a resin and a configuration member of an electronic component. A known or common coupling agent (E) can be used as the coupling agent (E), and the coupling agent (E) is not particularly limited.

Examples of the coupling agent (E) include: various silane-based compounds such as a silane compound having at least one selected from the group consisting of a primary amino group, a secondary amino group, and a tertiary amino group, epoxysilane, mercaptosilane, alkylsilane, ureidosilane, and vinylsilane; titanium-based compounds; aluminum chelates; and aluminum/zirconium-based compounds.

Examples of the coupling agent (E) include: silane-based coupling agents such as vinyltrichlorosilane, vinyltriethoxysilane, vinyltris(β-methoxyethoxy)silane, γ-methacryloxypropyltrimethoxysilane, β-(3,4-epoxycyclohexyl)ethyltrimethoxysilane, γ-glycidoxypropyltrimethoxysilane, γ-glycidoxypropylmethyldimethoxysilane, vinyltriacetoxysilane, γ-mercaptopropyltrimethoxysilane, γ-aminopropyltrimethoxysilane, γ-aminopropylmethyldimethoxysilane, γ-aminopropyltriethoxysilane, γ-aminopropylmethyldiethoxysilane, γ-anilinopropyltrimethoxysilane, γ-anilinopropyltriethoxysilane, γ-(N,N-dimethyl)aminopropyltrimethoxysilane, γ-(N,N-diethyl)aminopropyltrimethoxysilane, γ-(N,N-dibutyl)aminopropyltrimethoxysilane, γ-(N-methyl)anilinopropyltrimethoxysilane, γ-(N-ethyl)anilinopropyltrimethoxysilane, γ-(N,N-dimethyl)aminopropyltriethoxysilane, γ-(N,N-diethyl)aminopropyltriethoxysilane, γ-(N,N-dibutyl)aminopropyltriethoxysilane, γ-(N-methyl)anilinopropyltriethoxysilane, γ-(N-ethyl)anilinopropyltriethoxysilane, γ-(N,N-dimethyl)aminopropylmethyldimethoxysilane, γ-(N,N-diethyl)aminopropylmethyldimethoxysilane, γ-(N,N-dibutyl)aminopropylmethyldimethoxysilane, γ-(N-methyl)anilinopropylmethyldimethoxysilane, γ-(N-ethyl)anilinopropylmethyldimethoxysilane, N-(trimethoxysilylpropyl)ethylenediamine, N-(dimethoxymethylsilylisopropyl)ethylenediamine, methyltrimethoxysilane, dimethyldimethoxysilane, methyltriethoxysilane, γ-chloropropyltrimethoxysilane, hexamethyldisilane, vinyltrimethoxysilane, and γ-mercaptopropylmethyldimethoxysilane; and titanate-based coupling agents such as isopropyltriisostearoyltitanate, isopropyltris(dioctylpyrophosphate)titanate, isopropyltri(N-aminoethylaminoethyl)titanate, tetraoctylbis(ditridecylphosphite)titanate, tetra(2,2-diallyloxymethyl-1-butyl)bis(ditridecylphosphite)titanate, bis(dioctylpyrophosphate)oxyacetatetitanate, bis(dioctylpyrophosphate)ethylenetitanate, isopropyltrioctanoyltitanate, isopropyldimethacrylisostearoyltitanate, isopropyltridodecylbenzenesulfonyltitanate, isopropylisostearoyldiacryltitanate, isopropyltri(dioctylphosphate)titanate, isopropyltricumylphenyltitanate, and tetraisopropylbis(dioctylphosphite)titanate. Such coupling agents (E) may be used singly, or in combination of two or more kinds thereof.

In a case in which the liquid resin composition for compression molding includes the coupling agent (E), the percentage content of the coupling agent (E) is preferably from 0.1% by mass to 2.0% by mass, and more preferably from 0.2% by mass to 1.5% by mass with respect to the total amount of the inorganic filler (D) and the coupling agent (E). In a case in which the percentage content of the coupling agent (E) is 0.1% by mass or more, the effect of improving the dispersibility of the inorganic filler (D) by the coupling agent (E) tends to be able to be easily obtained. In a case in which the percentage content of the coupling agent (E) is 2.0% by mass or less, voids tend to be inhibited from being generated in a cured product of the liquid resin composition for compression molding.

-Organic Solvent (F)-

The liquid resin composition for compression molding may include an organic solvent (F), if necessary. A known or common organic solvent (F) can be used as the organic solvent (F), and the organic solvent (F) is not particularly limited.

In a case in which the liquid resin composition for compression molding includes the organic solvent (F), the percentage content of the organic solvent (F) is preferably less than 5% by mass with respect to the total amount of the constituents (A) to (F). In a case in which the percentage content of the organic solvent (F) is less than 5% by mass, the occurrence of the thinning of a film after curing tends to be suppressed.

-Additional Constituent-

The liquid resin composition for compression molding may include an additional constituent other than the constituents (A) to (F), if necessary.

The liquid resin composition for compression molding may include an additional epoxy compound other than the aliphatic epoxy compound (A) and the epoxy compound (B) having an aromatic ring in a molecule. A known or common epoxy compound other than the aliphatic epoxy compound (A) and the epoxy compound (B) having an aromatic ring in a molecule can be used as the additional epoxy compound, and the additional epoxy compound is not particularly limited. In a case in which the liquid resin composition for compression molding includes the additional epoxy compound, the percentage content of the additional epoxy compound is preferably from more than 0% by mass to 40% by mass, more preferably from more than 0% by mass to 30% by mass, and still more preferably from more than 0% by mass to 20% by mass with respect to the total amount (total epoxy compound: 100% by mass) of compound having an epoxy group, included in the liquid resin composition for compression molding.

The liquid resin composition for compression molding preferably includes an ion trapping agent as the additional constituent from the viewpoint of improving the migration resistance, moisture resistance, and high-temperature exposure characteristic of a semiconductor element such as an IC. The ion trapping agent is not particularly limited, and a known or common ion trapping agent can be used as the ion trapping agent. Examples of the ion trapping agent include hydrotalcites, and hydrous oxides of elements such as magnesium, aluminum, titanium, zirconium, and bismuth. Such ion trapping agents may be used singly, or in combination of two or more kinds thereof. Specific examples thereof include DHT-4A (trade name, Kyowa Chemical Industry Co., Ltd.) and IXE500 (trade name, Toagosei Co., Ltd.). The percentage content of the ion trapping agent in the liquid resin composition for compression molding is not particularly limited as long as the percentage content is an amount sufficient for enabling trapping of anions such as halogen ions, and cations such as sodium, and is preferably from 1% by mass to 10% by mass with respect to the total amount of the epoxy compound.

The liquid resin composition for compression molding preferably includes a curing accelerator, a colorant such as a dye, a pigment, or carbon black, a silicone oil, a surfactant, an antioxidant, a phosphate ester, a nitrogen-containing compound such as melamine, a melamine derivative, a compound having a triazine ring, a cyanuric acid derivative, or an isocyanuric acid derivative, a phosphorus/nitrogen-containing compound such as cyclophosphazene, a metal compound such as zinc oxide, iron oxide, molybdenum oxide, or ferrocene, or a conventionally known flame retardant such as an antimony oxide (for example, antimony trioxide, antimony tetroxide, or antimony pentoxide) or a brominated epoxy resin, if necessary, as the additional constituent.

The liquid resin composition for compression molding may be prepared using any technique as long as the various constituents described above can be homogeneously dispersed and mixed. Examples of common techniques for preparing a liquid resin composition for compression molding may include methods in which constituents in predetermined blending amounts are weighed, and dispersed and kneaded by a three-roll mill, a grinding machine, a planetary mixer, a hard mixer, a homomixer, or the like. A technique using a master batch in which each blending constituent is predispersed and preheated is preferred in view of a homogeneous dispersion property and flowability.

Conditions under which the liquid resin composition for compression molding of the disclosure is cured are not particularly limited. A temperature for heat treatment is preferably from 120° C. to 200° C., more preferably from 130° C. to 180° C., and still more preferably from 140° C. to 170° C. A heat treatment time is preferably from 15 minutes to 3 hours, and more preferably from 30 minutes to 2 hours.

The glass transformation temperature of a cured product of the liquid resin composition for compression molding of the disclosure, measured by a DMA method, is preferably 125° C. or more, and more preferably 150° C. or more.

The elastic modulus at a temperature less than the glass transformation temperature of a cured product of the liquid resin composition for compression molding of the disclosure, measured by a DMA method, is preferably 20 GPa or less, and more preferably 16 GPa or less.

The linear expansion coefficient at a temperature less than the glass transformation temperature of a cured product of the liquid resin composition for compression molding of the disclosure is preferably 15 ppm/° C. or less, and more preferably 12 ppm/° C. or less.

The viscosity at 25° C. of the liquid resin composition for compression molding of the disclosure is preferably less than 1000 Pa·s, more preferably 800 Pa·s or less, and still more preferably 500 Pa·s or less.

<Electronic Component Apparatus>

The electronic component apparatus of the disclosure includes an element sealed with the liquid resin composition for compression molding of the disclosure.

Examples of the electronic component apparatus include an electronic component apparatus obtained by mounting an electronic component such as an active element such as a semiconductor chip, a transistor, a diode, or a thyristor, or a passive element such as a capacitor, a resistor, a resistor array, a coil, or a switch on a support member such as a lead frame, a wired tape carrier, a wiring board, glass, or a silicon wafer, and by sealing a necessary portion with the liquid resin composition for compression molding of the disclosure.

Especially, the liquid resin composition for compression molding of the disclosure is effective for electronic component apparatuses requiring low warpage properties and high reliability, and is suitable particularly for a wafer level chip size package. Examples of methods of sealing an element using the liquid resin composition for compression molding of the disclosure include a dispensing method, a casting method, and a printing method, and a printing method is particularly preferred.

EXAMPLES

The invention will be described with reference to Examples. However, the invention is not limited to the following Examples. In the following Examples, "part(s)" and "%" refer to "part(s) by mass" and "% by mass", respectively, unless otherwise specified.

Examples 1 and 2, and Comparative Example 1

Each material set forth in Table 1 was mixed for 2 hours using a planetary mixer, and further stirred and defoamed for 1 hour using a hard mixer at a vacuum degree of from 80 Pa to 90 Pa, to produce a liquid resin composition for compression molding. In Table 1, a constituent (A), a constituent (B), a constituent (C), and a constituent (D) mean an aliphatic epoxy compound (A), an epoxy compound (B) having an aromatic ring in a molecule, a nitrogen-containing heterocyclic compound (C), and an inorganic filler (D), respectively. The unit of the composition of each constituent set forth in Table 1 is "part(s) by mass".

The produced liquid resin composition for compression molding was evaluated in each test described below. The obtained results are collectively set forth in Table 1.

(Viscosity and Thixotropy Index)

The viscosity of the produced liquid resin composition for compression molding was measured using an HB type viscometer from Brookfield under conditions of 25° C. and 10 rev/min. In a case in which a viscosity at 25° C. is less than 1000 Pa·s, high productivity can be obtained using a usual compression molding apparatus. A value obtained by dividing the measurement value of the viscosity of the liquid resin composition for compression molding, measured under conditions of 25° C. and 1 rev/min, by the measurement value of the viscosity measured under the conditions of 25° C. and 10 rev/min was regarded as a thixotropy index.
(Linear Expansion Coefficient)

The linear expansion coefficients of a cured product obtained by heat-curing the liquid resin composition for compression molding at 150° C. for 60 minutes were measured at from 50° C. to 70° C., and at from 180° C. to 200° C., respectively, by a TMA (thermomechanical analysis) method using a TMA4000SA series from Bruker AXS K.K. In a case in which a linear expansion coefficient at a temperature less than Tg is 12 ppm/° C. or less, the warpage of a semiconductor wafer can be sufficiently reduced.
(Glass Transformation Temperature (Tg) and Elastic Modulus)

The glass transformation temperature and elastic modulus of a cured product obtained by heat-curing the liquid resin composition for compression molding at 150° C. for 60 minutes were measured by a DMA (dynamic mechanical analysis, dynamic viscoelastic measurement) method using a DMS6100 from SII. A glass transformation temperature of 140° C. or more enables a semiconductor apparatus with high reliability to be obtained. An elastic modulus of 20 GPa or less at a temperature less than Tg is suitable for obtaining a semiconductor wafer with reduced warpage.
(Warpage)

A liquid resin composition layer for compression molding having a diameter of 292 mm and a thickness of 300 μm was formed on a silicon wafer having a diameter of 300 mm and a thickness of 300 μm using a mold, and heat-cured at 150° C. for 60 minutes, to make a sample. After the curing, a height difference between the center and end of the silicon wafer was measured as warpage using a ruler.

TABLE 1

| Material Name | | Example 1 | Example 2 | Comparative Example 1 |
|---|---|---|---|---|
| Constituent (A) | Epoxy Resin[1] | 3.2 | 2.1 | — |
| Constituent (B) | Epoxy Resin[2] | 11.5 | 7.7 | — |
| | Epoxy Resin[3] | 3.7 | 2.5 | — |
| | Epoxy Resin[4] | — | — | 4.5 |
| Constituent (C) | Imidazole[5] | 0.7 | 0.5 | 0.6 |
| Curing Agent | Acid Anhydride[6] | — | — | 7.5 |
| Constituent (D) | Silica Filler[7] | — | 68.0 | 68.0 |
| | Silica Filler[8] | — | 17.0 | 17.0 |
| | Silica Filler[9] | 78.0 | — | — |
| Additional Constituent | Silane Coupling Agent[10] | 0.2 | 0.2 | 0.2 |
| | Carbon Black[11] | 0.2 | 0.2 | 0.2 |
| | Silicone Oil[12] | 2.5 | 1.8 | 2.0 |
| Total | | 100.0 | 100.0 | 100.0 |
| Viscosity (Pa · s) | | 23 | 288 | 245 |
| Thixotropy Index | | 0.8 | 0.8 | 1.1 |
| Glass Transformation Temperature (° C.) | | 160 | 168 | 145 |
| Linear Expansion Coefficient (ppm/° C.) | <Tg | 11 | 7 | 8 |
| | >Tg | 30 | 18 | 36 |
| Elastic Modulus (GPa) | <Tg | 9.0 | 11.6 | 16.4 |
| Warpage (mm) | | 0 | 0 | 8 |

The detail of each of the materials (1) to (12) in Table 1 is as follows. In Table 1, "—" means that a corresponding material was not used.

(1) Yokkaichi Chemical Company Limited, polytetramethylene glycol diglycidyl ether (product name: EPOGOSEY PT (general grade), epoxy equivalent: 440 g/eq, average molecular weight: 880)
(2) Mitsubishi Chemical Corporation, aminophenol type epoxy compound (product name: jER 630, epoxy equivalent: 95 g/eq, average molecular weight: 285, viscosity at 25° C.: 700 mPa·s, compound name: N,N-bis (2,3-epoxypropyl)-4-(2,3-epoxypropoxy)aniline)
(3) ADEKA Corporation, toluidine type epoxy compound (product name: EP3980S, epoxy equivalent: 135 g/eq, average molecular weight: 270, viscosity at 25° C.: 50 mPa·s, compound name: N,N-diglycidylorthotoluidine)
(4) DIC Corporation, naphthalene type epoxy compound (product name: HP4032D, epoxy equivalent: 140 g/eq, average molecular weight: 280)
(5) SHIKOKU CHEMICALS CORPORATION, imidazole compound (product name: CUREZOL 2P4MZ)
(6) Hitachi Chemical Company, Ltd., methylhexahydrophthalic anhydride (product name: HN2200)
(7) NIPPON STEEL & SUMIKIN MATERIALS CO., LTD., spherical silica (product name: STW7010-20, average particle diameter: 10 μm)
(8) Admatechs Company Limited, spherical silica (product name: SE2300, average particle diameter: 0.6 μm)
(9) Admatechs Company Limited, spherical silica (product name: 2umSM-E4, average particle diameter: 2 μm)
(10) Shin-Etsu Chemical Co., Ltd., silane coupling agent (product name: KBM403, compound name: γ-glycidoxypropyltrimethoxysilane)
(11) Orion Engineered Carbons, carbon black (product name: SPECIAL BLACK 4)
(12) Dow Corning Toray Co., Ltd., silicone oil (product name: SF8421)

The average particle diameter of all the silica fillers included in Example 2 and Comparative Example 1 was 8 μm.

As is clear from Table 1, the warpage of a silicon wafer was 0 mm while the viscosity, the glass transformation temperature, the linear expansion coefficient, and the elastic modulus were in practical ranges, in Examples 1 and 2. In contrast, the warpage was as large as 8 mm in Comparative Example 1 in which the conventional acid anhydride curing agent was used.

As described above, use of the liquid resin composition for compression molding of the disclosure enables a large number of elements to be collectively sealed even on a thinner silicon wafer or a silicon wafer having a 12-inch or larger size. Even in the case of applying the liquid resin composition for compression molding of the disclosure to, e.g., a compound semiconductor wafer such as a SiC (silicon carbide) wafer, a sapphire wafer, or a GaAs (gallium arsenide) wafer, the occurrence of the warpage of the semiconductor wafer is considered to be able to be suppressed.

The disclosure of Japanese Patent Application No. 2017-108716 filed on May 31, 2017, is hereby incorporated by reference in its entirety.

All the documents, patent applications and technical standards that are described in the present specification are hereby incorporated by reference to the same extent as if each individual document, patent application or technical standard is concretely and individually described to be incorporated by reference.

The invention claimed is:

1. A liquid resin composition for compression molding, comprising an aliphatic epoxy compound (A), an epoxy compound (B) having an aromatic ring in a molecule, a nitrogen-containing heterocyclic compound (C) in an amount within the range of from 2 parts by mass to 12 parts by mass per 100 parts by mass in total of epoxy compounds, and an inorganic filler (D),
   wherein the epoxy compound (B) having an aromatic ring in a molecule comprises N,N-diglycidylorthotoluidine and N,N-bis(2,3-epoxypropyl)-4-(2,3-epoxypropoxy) aniline,
   wherein a curing agent other than the nitrogen-containing heterocyclic compound (C) is in an amount of less than 0.1 equivalent with respect to 1 equivalent of epoxy compounds in the liquid resin composition, and
   wherein a cured product of the liquid resin composition for compression molding has a linear expansion coefficient of 15 ppm/° C. or less at a temperature less than the cure product's glass transformation temperature.

2. The liquid resin composition for compression molding according to claim 1, wherein the aliphatic epoxy compound (A) comprises a compound represented by the following Formula (1):

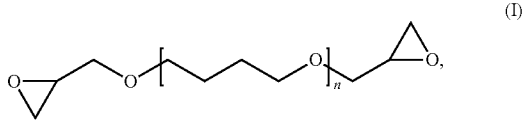

wherein n is an integer from 1 to 15.

3. The liquid resin composition for compression molding according to claim 2, wherein a number-average molecular weight of the compound represented by Formula (I) is from 200 to 10000.

4. The liquid resin composition for compression molding according to claim 3, further comprising a coupling agent (E).

5. The liquid resin composition for compression molding according to claim 2, further comprising a coupling agent (E).

6. The liquid resin composition for compression molding according to claim 1, wherein a number-average molecular weight of the aliphatic epoxy compound (A) is from 200 to 10000.

7. The liquid resin composition for compression molding according to claim 6, further comprising a coupling agent (E).

8. The liquid resin composition for compression molding according to claim 1, further comprising a coupling agent (E).

9. An electronic component apparatus, comprising an element sealed with the liquid resin composition for compression molding according to claim 1.

10. A liquid resin composition for compression molding, comprising an aliphatic epoxy compound (A), an epoxy compound (B) having an aromatic ring in a molecule, a nitrogen-containing heterocyclic compound (C), and an inorganic filler (D), each of the aliphatic epoxy compound (A), the epoxy compound (B), and the inorganic filler (D) being in amounts configured to allow compression molding,
   wherein an average particle diameter of the inorganic filler (D) is within the range of from 1 μm to 20 μm,
   wherein an amount of the nitrogen-containing heterocyclic compound (C) is within a range of from 2 parts by mass to 12 parts by mass per 100 parts by mass in total of epoxy compounds,
   wherein the epoxy compound (B) having an aromatic ring in a molecule comprises N,N-diglycidylorthotoluidine and N,N-bis (2,3-epoxypropyl)-4-(2,3-epoxypropoxy) aniline,
wherein a curing agent other than the nitrogen-containing heterocyclic compound (C) is in an amount of less than 0.1 equivalent with respect to 1 equivalent of epoxy compounds in the liquid resin composition, and
   wherein a cured product of the liquid resin composition for compression molding has a linear expansion coefficient of 15 ppm/° C. or less at a temperature less than the cure product's glass transformation temperature.

* * * * *